United States Patent
Ritchie et al.

(10) Patent No.: US 11,915,917 B2
(45) Date of Patent: *Feb. 27, 2024

(54) METHODS AND APPARATUS FOR REDUCING SPUTTERING OF A GROUNDED SHIELD IN A PROCESS CHAMBER

(71) Applicant: APPLIED MATERIALS, INC., Santa Clara, CA (US)

(72) Inventors: Alan Ritchie, Pleasanton, CA (US); John C. Forster, Mountain View, CA (US); Muhammad Rasheed, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 144 days.

This patent is subject to a terminal disclaimer.

(21) Appl. No.: 16/902,194

(22) Filed: Jun. 15, 2020

(65) Prior Publication Data

US 2020/0312640 A1 Oct. 1, 2020

Related U.S. Application Data

(62) Division of application No. 13/798,021, filed on Mar. 12, 2013, now Pat. No. 10,692,706.

(51) Int. Cl.
*H01J 37/34* (2006.01)
*H01J 37/32* (2006.01)
*C23C 14/34* (2006.01)

(52) U.S. Cl.
CPC .......... *H01J 37/3441* (2013.01); *C23C 14/34* (2013.01); *H01J 37/32504* (2013.01); *H01J 37/32651* (2013.01); *H01J 37/3405* (2013.01); *H01J 37/3411* (2013.01)

(58) Field of Classification Search
CPC ............... H01J 37/3405; H01J 37/3411; H01J 37/3441; H01J 37/32504; H01J 37/32651; C23C 14/34

See application file for complete search history.

(56) References Cited

U.S. PATENT DOCUMENTS

| | | | |
|---|---|---|---|
| 5,431,799 A * | 7/1995 | Mosely | H01J 37/32082 204/298.06 |
| 5,624,536 A * | 4/1997 | Wada | C23C 14/34 204/192.12 |
| 5,744,016 A * | 4/1998 | Yamada | C23C 14/0068 204/192.12 |
| 6,162,297 A | 12/2000 | Mintz et al. | |
| 6,398,929 B1 * | 6/2002 | Chiang | H01L 21/76862 204/298.11 |
| 6,444,099 B1 | 9/2002 | Sasaki et al. | |
| 10,692,706 B2 * | 6/2020 | Ritchie | H01J 37/3405 |
| 2005/0284372 A1 | 12/2005 | Murugesh et al. | |

* cited by examiner

*Primary Examiner* — Michael A Band
(74) *Attorney, Agent, or Firm* — MOSER TABOADA

(57) ABSTRACT

Methods and apparatus for physical vapor deposition are provided herein. In some embodiments, a process kit shield for use in a physical vapor deposition chamber may include an electrically conductive body having one or more sidewalls defining a central opening, wherein the body has a ratio of a surface area of inner facing surfaces of the one or more sidewalls to a height of the one or more sidewalls of about 2 to about 3.

20 Claims, 3 Drawing Sheets

METHODS AND APPARATUS FOR REDUCING SPUTTERING OF A GROUNDED SHIELD IN A PROCESS CHAMBER

CROSS-REFERENCE TO RELATED APPLICATIONS

This application is a divisional of co-pending U.S. patent application Ser. No. 13/798,021, filed Mar. 12, 2013, of which is herein incorporated by reference.

FIELD

Embodiments of the present invention generally relate to physical vapor deposition processing equipment.

BACKGROUND

In a physical vapor deposition (PVD) chamber, a region exists between a plasma and its surrounding surfaces, such as powered, grounded, or floating electrodes, referred to as the dark space region or sheath region. A typical PVD chamber may use a radio frequency (RF) power source to form the plasma. As the frequency of the RF source increases, the plasma density increases and the sheath width decreases. The inventors have observed that this phenomenon can negatively affect the desired plasma geometry at the plasma boundary and cause secondary plasma ignition in unwanted areas. In certain PVD chambers, a grounded electrode (referred to herein as the grounded shield) acts as the main current return path from the plasma back to the generator. In the case of RF driven plasma discharges, the plasma potential can be in the region of a few tens to a few hundred volts positive with respect to the grounded shield. This potential difference coupled with the high plasma-ion density can cause undesirable sputtering of the grounded shield, which can be a source of contamination of the chamber and/or the substrate.

Accordingly, the inventors have provided methods and apparatus for reducing the sputtering of a grounded shield in a process chamber.

SUMMARY

Methods and apparatus for physical vapor deposition are provided herein. In some embodiments, a process kit shield for use in a physical vapor deposition chamber may include an electrically conductive body having one or more sidewalls defining a central opening, wherein the body has a ratio of a surface area of inner facing surfaces of the one or more sidewalls to a height of the one or more sidewalls of about 2 to about 3.

In some embodiments, a substrate processing apparatus may include a chamber body having a substrate support disposed therein; a target coupled to the chamber body opposite the substrate support; an RF power source to form a plasma within the chamber body; and a grounded shield having an inner wall disposed between the target and the substrate support; and wherein a ratio of a diameter of the target to a height of the grounded shield is about 4, and wherein a ratio of a surface area of the grounded shield to a surface area of the target is about 1 to about 1.5.

In some embodiments, a substrate processing apparatus may include a chamber body having a substrate support disposed therein; a target coupled to the chamber body opposite the substrate support; an RF power source to form a plasma within the chamber body; and a grounded shield having an inner wall disposed between the target and the substrate support; wherein a ratio of a diameter of the target to a height of the grounded shield is about 4.1 to about 4.3, and wherein the ratio of the surface area of the grounded shield to a height of the grounded shield is about 2 to about 3.

In some embodiments, a method of processing a substrate disposed within a substrate processing chamber, wherein the substrate processing chamber comprises a chamber body and a substrate support disposed therein, the method may include forming a plasma between a target and the substrate at a frequency of at least about 40 MHz and a pressure of about 60 millitorr to about 140 millitorr, wherein the target is coupled to the chamber body opposite the substrate, which is disposed atop the substrate support, and wherein a grounded shield having an inner wall is disposed between the target and the substrate support, and wherein a ratio of a surface area of the grounded shield to a surface area of the target is about 1 to about 1.5.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
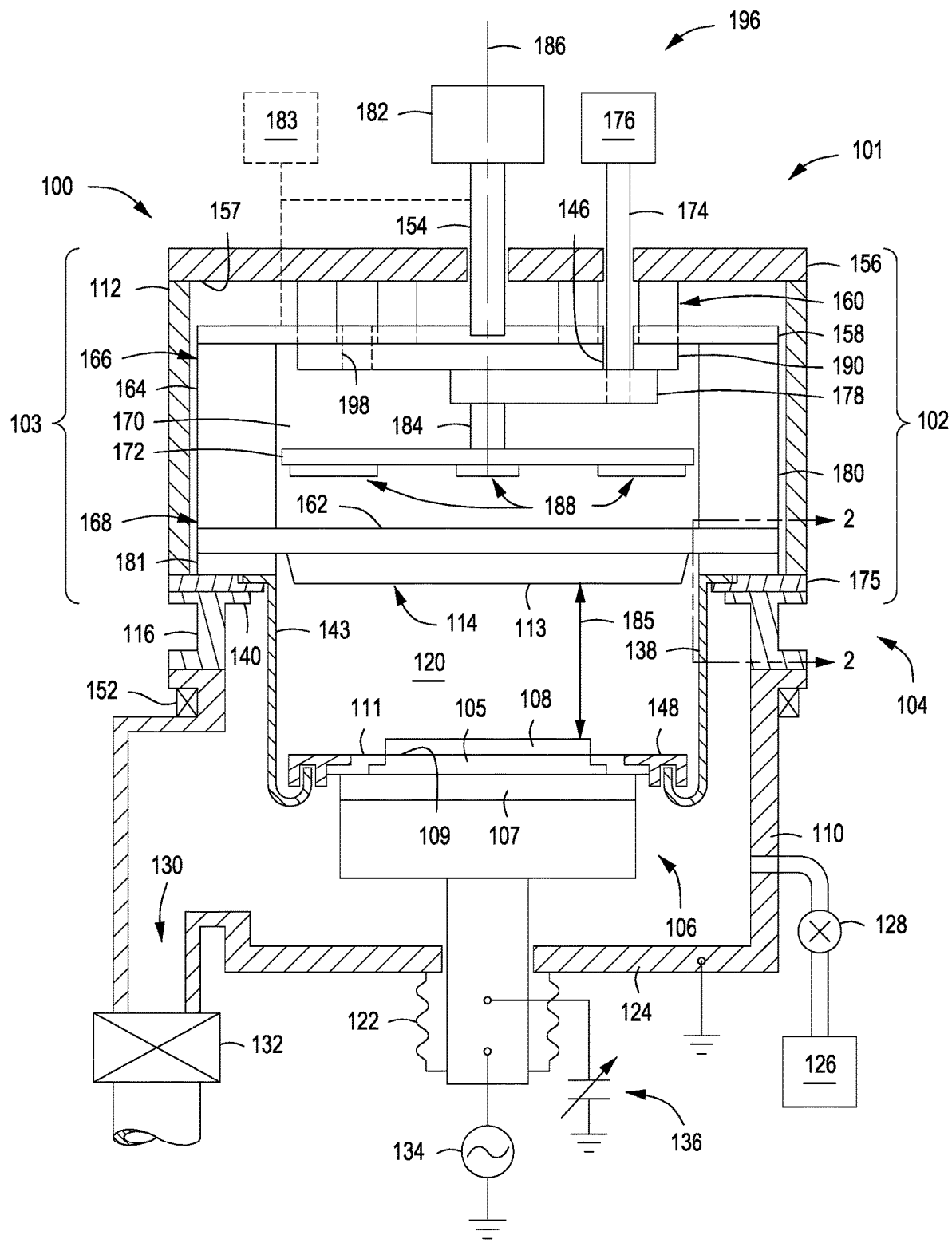
FIG. 1 depicts a schematic cross sectional view of a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for improved physical vapor deposition (PVD) processing equipment are provided herein. In at least some embodiments of the present invention, the improved methods and apparatus provide a grounded shield for a PVD processing apparatus that may advantageously lower the potential difference to the grounded shield while maintaining target to substrate spacing, thereby facilitating PVD processing with reduced or eliminated sputtering of the grounded shield. In at least some embodiments, such PVD processes may advantageously be high density plasma assisted PVD processes, such as described below.

FIG. 1 depicts a simplified, cross-sectional view of an illustrative PVD chamber 100 having a magnetron assembly in accordance with some embodiments of the present invention. The specific configuration of the PVD chamber is illustrative and PVD chambers having other configurations may also benefit from modification in accordance with the teachings provided herein. Examples of suitable PVD chambers include any of the ENDURA® line of PVD processing chambers, commercially available from Applied Materials, Inc., of Santa Clara, California Other processing chambers from Applied Materials, Inc. or other manufactures may also benefit from the inventive apparatus disclosed herein.

In some embodiments of the present invention, the PVD chamber 100 includes a chamber lid 101 disposed atop a chamber body 104 and removable from the chamber body 104. The chamber lid 101 generally includes a target assembly 102 and a grounding assembly 103. The chamber body 104 contains a substrate support 106 for receiving a substrate 108 thereon. The substrate support 106 is configured to support a substrate such that a center of the substrate is aligned with a central axis 186 of the PVD chamber 100. The substrate support 106 may be located within a lower grounded enclosure wall 110, which may be a wall of the chamber body 104. The lower grounded enclosure wall 110 may be electrically coupled to the grounding assembly 103 of the chamber lid 101 such that an RF return path is provided to an RF power source 182 disposed above the chamber lid 101. Alternatively, other RF return paths are possible, such as those that travel from the substrate support 106 via a process kit shield (e.g., a grounded shield 138 as discussed below) and ultimately back to the grounding assembly 103 of the chamber lid 101. The RF power source 182 may provide RF energy to the target assembly 102 as discussed below.

The substrate support 106 has a material-receiving surface facing a principal surface of a target 114 and supports the substrate 108 to be sputter coated with material ejected from the target in planar position opposite to the principal surface of the target 114. The substrate support 106 may include a dielectric member 105 having a substrate processing surface 109 for supporting the substrate 108 thereon. In some embodiments, the substrate support 108 may include one or more conductive members 107 disposed below the dielectric member 105. For example, the dielectric member 105 and the one or more conductive members 107 may be part of an electrostatic chuck, RF electrode, or the like which may be used to provide chucking or RF power to the substrate support 106.

The substrate support 106 may support the substrate 108 in a first volume 120 of the chamber body 104. The first volume 120 is a portion of the inner volume of the chamber body 104 that is used for processing the substrate 108 and may be separated from the remainder of the inner volume (e.g., a non-processing volume) during processing of the substrate 108 (for example, via the shield 138). The first volume 120 is defined as the region above the substrate support 106 during processing (for example, between the target 114 and the substrate support 106 when in a processing position).

In some embodiments, the substrate support 106 may be vertically movable to allow the substrate 108 to be transferred onto the substrate support 106 through an opening (such as a slit valve, not shown) in the lower portion of the chamber body 104 and thereafter raised to a processing position. A bellows 122 connected to a bottom chamber wall 124 may be provided to maintain a separation of the inner volume of the chamber body 104 from the atmosphere outside of the chamber body 104. One or more gases may be supplied from a gas source 126 through a mass flow controller 128 into the lower part of the chamber body 104. An exhaust port 130 may be provided and coupled to a pump (not shown) via a valve 132 for exhausting the interior of the chamber body 104 and to facilitate maintaining a desired pressure inside the chamber body 104.

An RF bias power source 134 may be coupled to the substrate support 106 in order to induce a negative DC bias on the substrate 108. In addition, in some embodiments, a negative DC self-bias may form on the substrate 108 during processing. In some embodiments, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively or in combination, a capacitance tuner 136 may be coupled to the substrate support 106 for adjusting voltage on the substrate 108 for applications where RF bias power is not be desired.

The chamber body 104 further includes a grounded process kit shield (shield 138) to surround the processing, or first volume, of the chamber body 104 and to protect other chamber components from damage and/or contamination from processing. In some embodiments, the shield 138 may be coupled to a ledge 140 of an upper grounded enclosure wall 116 of the chamber body 104. In other embodiments, and as illustrated in FIG. 1, the shield 138 may be coupled to the chamber lid 101, for example via a retaining ring 175.

The grounded shield 138 comprises an inner wall 143 disposed between the target 114 and the substrate support 106. The height of the shield 138 depends upon the distance 185 between the target 114 and the substrate 108. The distance 185 between the target 114 and the substrate 108, and correspondingly, the height of the shield 138, is scaled based on the diameter of the substrate 108. In some embodiments, the ratio of the diameter of the target 114 to the diameter of the substrate is about 1.4. For example, a process chamber for processing a 300 mm substrate may have a target 114 having a diameter of about 419 mm or, in some embodiments, a process chamber for processing a 450 mm substrate may have a target 114 having a diameter of about 625 mm. In some embodiments, the ratio of the diameter of the target 114 to the height of the shield 138 is about 4.1 to about 4.3, or in some embodiments, about 4.2. For example, in some embodiments of a process chamber for processing a 300 mm substrate, the target 114 may have a diameter of about 419 mm and the shield 138 may have a height of about 100 mm or, in some embodiments of a process chamber for processing a 450 mm substrate 108, the target 114 may have a diameter of about 625 mm and the shield 138 may have a height of about 150 mm. Other diameters and heights may also be used to provide the desired ratio. In process chambers having the ratios described above, the distance 185 between the target 114 and the substrate 108 is about 50.8 mm to about 152.4 mm for a 300 mm substrate 108 or about 101.6 mm to about 203.2 mm for a 450 mm substrate. A process chamber having the above configurations is referred to herein as a "short throw" process chamber.

The short throw process chamber advantageously increases the deposition rate over process chambers having longer target to substrate distances 185. For example, for some processes, conventional process chambers having longer target to substrate distances provide a deposition rate of about 1 to about 2 angstroms/second. In comparison, for similar processes in a short throw process chamber, a deposition rate of about 5 to about 10 angstroms/second can be obtained while maintaining high ionization levels. In some embodiments, a process chamber in accordance with embodiments of the present invention may provide a deposition rate of about 10 angstroms/second. High ionization levels at such short spacing can be obtained by providing a high pressure, for example, about 60 millitorr to about 140 millitorr, and a very high driving frequency, for example, from about 27 MHz to about 162 MHz, for example such as at about such readily commercially available frequencies as 27.12, 40.68, 60, 81.36, 100, 122, or 162.72 MHz.

However, the inventors have observed that achieving high deposition rates in conventional short throw process chambers can result in an undesirable sputtering of the grounded shield 138 caused by a high plasma potential. Sputtering of the shield 138 causes undesirable contamination within the process chamber 100. The sputtering of the shield 138 is a result of the high voltage on the shield 138. The amount of voltage that appears on the target 114 (i.e., the powered electrode) and the grounded shield 138 (i.e., the grounded electrode) is dependent on the ratio of the surface area of the shield 138 to the surface area of the target 114, as a greater voltage appears on the smaller electrode. Typically, the surface area of the target 114 is larger than the surface area of the shield 138 resulting in a greater voltage upon the shield 138, and in turn, resulting in the undesired sputtering of the shield. For example, in some embodiments of a process chamber for processing a 300 mm substrate 108, the target may have a diameter of about 419 mm with a corresponding surface area of about 138 $mm^2$ and the shield 138 may have a height of about 100 mm with a corresponding surface area of about 132 $mm^2$ or, in some embodiments of a process chamber for processing a 450 mm substrate 108, the target may have a diameter of about 625 mm with a corresponding surface area of about 307 $mm^2$ and the shield 138 may have a height of about 150 mm with a corresponding surface area of about 295,000 $mm^2$. The inventors have observed that in some embodiments of process chambers where the ratio of the surface area of the shield 138 to the surface area of the target 114 is less than 1, a greater voltage is incurred upon the shield 138, which in turn, results in the undesired sputtering of the shield. Thus, in order to advantageously minimize or prevent the sputtering of the shield 138, the inventors have observed that the surface area of the shield 138 needs to be greater than the surface area of the target 114. For example, the inventors have observed that a ratio of the surface area of the shield 138 to the surface area of the target 114 of about 1 to about 1.5 advantageously minimizes or prevents the sputtering of the shield 138.

However, the surface area of the shield 138 cannot be increased by simply increasing the height of the shield 138 due to the desired ratio of the diameter of the target 114 to the height of the shield 138, as discussed above. The inventors have observed that, in some embodiments of a process chamber having the processing conditions discussed above (e.g., process pressures and RF frequencies used), the ratio of the surface area of the shield 138 to the height of the shield 138 must be about 2 to about 3 to advantageously minimize or prevent the sputtering of the shield 138. Furthermore, the diameter of the shield 138 cannot be increased sufficiently to increase the surface area of the shield 138 to prevent sputtering of the shield 138 due to physical constraint in the size of the process chamber. For example, an increase in the diameter of the shield 138 of 25.4 mm results in a surface area increase of only 6%, which is insufficient to prevent the sputtering of the shield 138.

Figure 2:
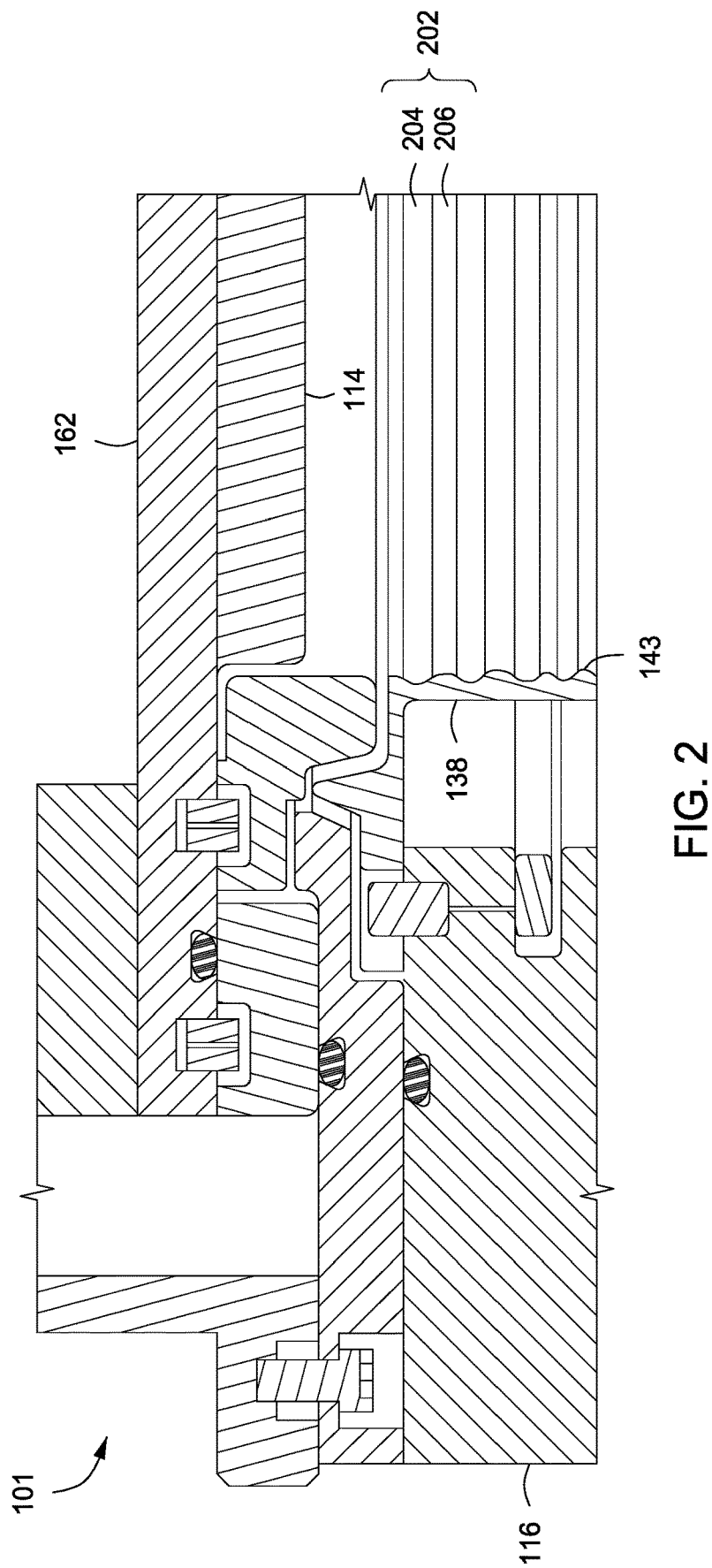
FIG. 2 depicts a sectional view of a support member and surrounding structure in accordance with some embodiments of the present invention.

Thus, in some embodiments, as depicted in FIG. 2, in order to obtain the desired ratio of the surface area of the shield 138 to the surface area of the target 114 or the required ratio of the surface area of the shield 138 to the height of the shield 138 as described above, the shield 138 includes a plurality of waves 202 comprising a concave portion 204 and a convex portion 206, which advantageously increase the surface area of the shield 138 by about 50% while maintaining the same overall height of the shield 138. For example, in some embodiments of a short throw process chamber for processing a 300 mm substrate 108 and having the target diameter and shield height described above, the inclusion of a plurality of waves 202 increases the surface area of the shield 138 from about 132 mm without the plurality of waves 202 to about 207 mm, while maintaining the ratio of the diameter of the target 114 to the height of the shield 138. As a result, the ratio of the surface area of the shield 138 to the surface area of the target 114 with the plurality of waves 202 is increased to about 1.5 and the ratio of the surface area of the shield 138 to the height of the shield 138 is increased to about 2. In some embodiments of a process chamber processing a 450 mm substrate 108 having the target diameter and shield height described above, the inclusion of a plurality of waves 202 increases the surface area of the shield 138 from about 295 mm without the plurality of waves 202 to about 463 mm while maintaining the ratio of diameter of the target 114 to the height of the shield 138. As a result, the ratio of the surface area of the shield 138 to the surface area of the target 114 with the plurality of waves 202 is increased to about 1.5 and the ratio of the surface area of the shield 138 to the height of the shield 138 is increased to about 3.

The concave portion 204 of the waves 202 are sized to advantageously allow the plasma sheath to form within the concave portion 204 of each wave 202. As such, the size of the concave portion 204 of the waves will depend upon the frequencies used for processing. For example, in some embodiments using RF frequencies as disclosed herein (e.g., about 27 to about 162 MHz), the period of the wave 202 is about 6 mm to about 20 mm. Increasing or decreasing the number of waves 202 in the shield 138 advantageously allows for the flexibility of controlling the plasma potential (e.g., the voltage on the shield) without changing the distance 185 between the target 114 and the substrate 108.

Returning to FIG. 1, the chamber lid 101 rests on the ledge 140 of the upper grounded enclosure wall 116. Similar to the lower grounded enclosure wall 110, the upper grounded enclosure wall 116 may provide a portion of the RF return path between the upper grounded enclosure wall 116 and the grounding assembly 103 of the chamber lid 101. However, other RF return paths are possible, such as via the grounded shield 138.

As discussed above, the shield 138 extends downwardly and may include one or more sidewalls configured to surround the first volume 120. The shield 138 extends along, but is spaced apart from, the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138).

A first ring 148 (e.g., a cover ring) rests on the top of the u-shaped portion (e.g., a first position of the first ring 148) when the substrate support 106 is in its lower, loading position (not shown) but rests on the outer periphery of the substrate support 106 (e.g., a second position of the first ring 148) when the substrate support 106 is in its upper, deposition position (as illustrated in FIG. 1) to protect the substrate support 106 from sputter deposition.

An additional dielectric ring 111 may be used to shield the periphery of the substrate 108 from deposition. For example, the dielectric ring 111 may be disposed about a peripheral edge of the substrate support 106 and adjacent to the substrate processing surface 109, as illustrated in FIG. 1.

The first ring 148 may include protrusions extending from a lower surface of the first ring 148 on either side of the inner upwardly extending u-shaped portion of the bottom of the shield 138. An innermost protrusion may be configured to interface with the substrate support 106 to align the first ring 148 with respect to the shield 128 when the first ring 148 is moved into the second position as the substrate support is moved into the processing position. For example, a substrate support facing surface of the innermost protrusion may be tapered, notched or the like to rest in/on a corresponding surface on the substrate support 106 when the first ring 148 is in the second position.

In some embodiments, a magnet 152 may be disposed about the chamber body 104 for selectively providing a magnetic field between the substrate support 106 and the target 114. For example, as shown in FIG. 1, the magnet 152 may be disposed about the outside of the chamber wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 101 generally includes the grounding assembly 103 disposed about the target assembly 102. The grounding assembly 103 may include a grounding plate 156 having a first surface 157 that may be generally parallel to and opposite a backside of the target assembly 102. A grounding shield 112 may extend from the first surface 157 of the grounding plate 156 and surround the target assembly 102. The grounding assembly 103 may include a support member 175 to support the target assembly 102 within the grounding assembly 103.

In some embodiments, the support member 175 may be coupled to a lower end of the grounding shield 112 proximate an outer peripheral edge of the support member 175 and extends radially inward to support a seal ring 181, the target assembly 102 and optionally, a dark space shield (e.g., that may be disposed between the shield 138 and the target assembly 102, not shown). The seal ring 181 may be a ring or other annular shape having a desired cross-section to facilitate interfacing with the target assembly 102 and with the support member 175. The seal ring 181 may be made of a dielectric material, such as ceramic. The seal ring 181 may insulate the target assembly 102 from the ground assembly 103.

The support member 175 may be a generally planar member having a central opening to accommodate the shield 138 and the target 114. In some embodiments, the support member 175 may be circular, or disc-like in shape, although the shape may vary depending upon the corresponding shape of the chamber lid and/or the shape of the substrate to be processed in the process chamber 100. In use, when the chamber lid 101 is opened or closed, the support member 175 maintains the shield 138 in proper alignment with respect to the target 114, thereby minimizing the risk of misalignment due to chamber assembly or opening and closing the chamber lid 101.

The target assembly 102 may include a source distribution plate 158 opposing a backside of the target 114 and electrically coupled to the target 114 along a peripheral edge of the target 114. The target 114 may comprise a source material 113 to be deposited on a substrate, such as the substrate 108 during sputtering, such as a metal, metal oxide, metal alloy, magnetic material, or the like. In some embodiments, the target 114 may include a backing plate 162 to support the source material 113. The backing plate 162 may comprise a conductive material, such as copper-zinc, copper-chrome, or the same material as the target, such that RF, and optionally DC, power can be coupled to the source material 113 via the backing plate 162. Alternatively, the backing plate 162 may be non-conductive and may include conductive elements (not shown) such as electrical feedthroughs or the like.

A conductive member 164 may be disposed between the source distribution plate and the backside of the target 114 to propagate RF energy from the source distribution plate to the peripheral edge of the target 114. The conductive member 164 may be cylindrical and tubular, with a first end 166 coupled to a target-facing surface of the source distribution plate 158 proximate the peripheral edge of the source distribution plate 158 and a second end 168 coupled to a source distribution plate-facing surface of the target 114 proximate the peripheral edge of the target 114. In some embodiments, the second end 168 is coupled to a source distribution plate facing surface of the backing plate 162 proximate the peripheral edge of the backing plate 162.

The target assembly 102 may include a cavity 170 disposed between the backside of the target 114 and the source distribution plate 158. The cavity 170 may at least partially house a magnetron assembly 196. The cavity 170 is at least partially defined by the inner surface of the conductive member 164, a target facing surface of the source distribution plate 158, and a source distribution plate facing surface (e.g., backside) of the target 114 (or backing plate 162). In some embodiments, the cavity 170 may be at least partially filled with a cooling fluid, such as water ($H_2O$) or the like. In some embodiments, a divider (not shown) may be provided to contain the cooling fluid in a desired portion of the cavity 170 (such as a lower portion, as shown) and to prevent the cooling fluid from reaching components disposed on the other side of the divider.

An insulative gap 180 is provided between the grounding plate 156 and the outer surfaces of the source distribution plate 158, the conductive member 164, and the target 114 (and/or backing plate 162). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 should be between about 5 to about 40 mm.

The grounding assembly 103 and the target assembly 102 may be electrically separated by the seal ring 181 and by one or more of insulators 160 disposed between the first surface 157 of the grounding plate 156 and the backside of the target assembly 102, e.g., a non-target facing side of the source distribution plate 158.

The target assembly 102 has the RF power source 182 connected to an electrode 154 (e.g., a RF feed structure). The RF power source 182 may include an RF generator and a matching circuit, for example, to minimize reflected RF energy reflected back to the RF generator during operation. For example, RF energy supplied by the RF power source 182 may range in frequency from about 13.56 MHz and to about 162 MHz or above. For example, non-limiting frequencies such as 13.56 MHz, 27.12 MHz, 60 MHz, or 162 MHz can be used.

In some embodiments, a second energy source 183 may be coupled to the target assembly 102 to provide additional energy to the target 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 102 in any location suitable to electrically couple the DC energy to the target 114, such as the electrode 154 or some other conductive member (such as the source distribution plate 158). In embodiments where the second energy source 183 is a second RF power source, the second energy source may be coupled to the target assembly 102 via the electrode 154.

The electrode 154 may be cylindrical or otherwise rod-like and may be aligned with a central axis 186 of the PVD chamber 100 (e.g., the electrode 154 may be coupled to the target assembly at a point coincident with a central axis of the target, which is coincident with the central axis 186). The electrode 154, aligned with the central axis 186 of the PVD chamber 100, facilitates applying RF energy from the RF source 182 to the target 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter, however, the smaller the diameter of the electrode 154, the closer the RF energy application approaches a true single point. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like.

The electrode 154 may pass through an opening in the grounding plate 156 and is coupled to a source distribution plate 158. The grounding plate 156 may comprise any suitable conductive material, such as aluminum, copper, or the like. Open spaces between the one or more insulators 160 allow for RF wave propagation along the surface of the source distribution plate 158. In some embodiments, the one or more insulators 160 may be symmetrically positioned with respect to the central axis 186 of the PVD chamber 100 Such positioning may facilitate symmetric RF wave propagation along the surface of the source distribution plate 158 and, ultimately, to a target 114 coupled to the source distribution plate 158. The RF energy may be provided in a more symmetric and uniform manner as compared to conventional PVD chambers due, at least in part, to the central position of the electrode 154.

One or more portions of a magnetron assembly 196 may be disposed at least partially within the cavity 170. The magnetron assembly provides a rotating magnetic field proximate the target to assist in plasma processing within the process chamber 104. In some embodiments, the magnetron assembly 196 may include a motor 176, a motor shaft 174, a gearbox 178, a gearbox shaft 184, and a rotatable magnet (e.g., a plurality of magnets 188 coupled to a magnet support member 172).

The magnetron assembly 196 is rotated within the cavity 170. For example, in some embodiments, the motor 176, motor shaft 174, gear box 178, and gearbox shaft 184 may be provided to rotate the magnet support member 172. In some embodiments (not shown), the magnetron drive shaft may be disposed along the central axis of the chamber, with the RF energy coupled to the target assembly at a different location or in a different manner. As illustrated in FIG. 1, in some embodiments, the motor shaft 174 of the magnetron may be disposed through an off-center opening in the grounding plate 156. The end of the motor shaft 174 protruding from the grounding plate 156 is coupled to a motor 176. The motor shaft 174 is further disposed through a corresponding off-center opening through the source distribution plate 158 (e.g., a first opening 146) and coupled to a gear box 178. In some embodiments, one or more second openings 198 may be disposed though the source distribution plate 158 in a symmetrical relationship to the first opening 146 to advantageously maintain axisymmetric RF distribution along the source distribution plate 158. The one or more second openings 198 may also be used to allow access to the cavity 170 for items such as sensors or the like.

The gear box 178 may be supported by any suitable means, such as by being coupled to a bottom surface of the source distribution plate 158. The gear box 178 may be insulated from the source distribution plate 158 by fabricating at least the upper surface of the gear box 178 from a dielectric material, or by interposing an insulator layer 190 between the gear box 178 and the source distribution plate 158, or the like. The gear box 178 is further coupled to the magnet support member 172 via the gear box shaft 184 to transfer the rotational motion provided by the motor 176 to the magnet support member 172 (and hence, the plurality of magnets 188). The gear box shaft 184 may advantageously be coincident with the central axis 186 of the PVD process chamber 100.

The magnet support member 172 may be constructed from any material suitable to provide adequate mechanical strength to rigidly support the plurality of magnets 188. The plurality of magnets 188 may be configured in any manner to provide a magnetic field having a desired shape and strength to provide a more uniform full face erosion of the target as described herein.

Alternatively, the magnet support member 172 may be rotated by any other means with sufficient torque to overcome the drag caused on the magnet support member 172 and attached plurality of magnets 188, for example due to the cooling fluid, when present, in the cavity 170.

Figure 3:
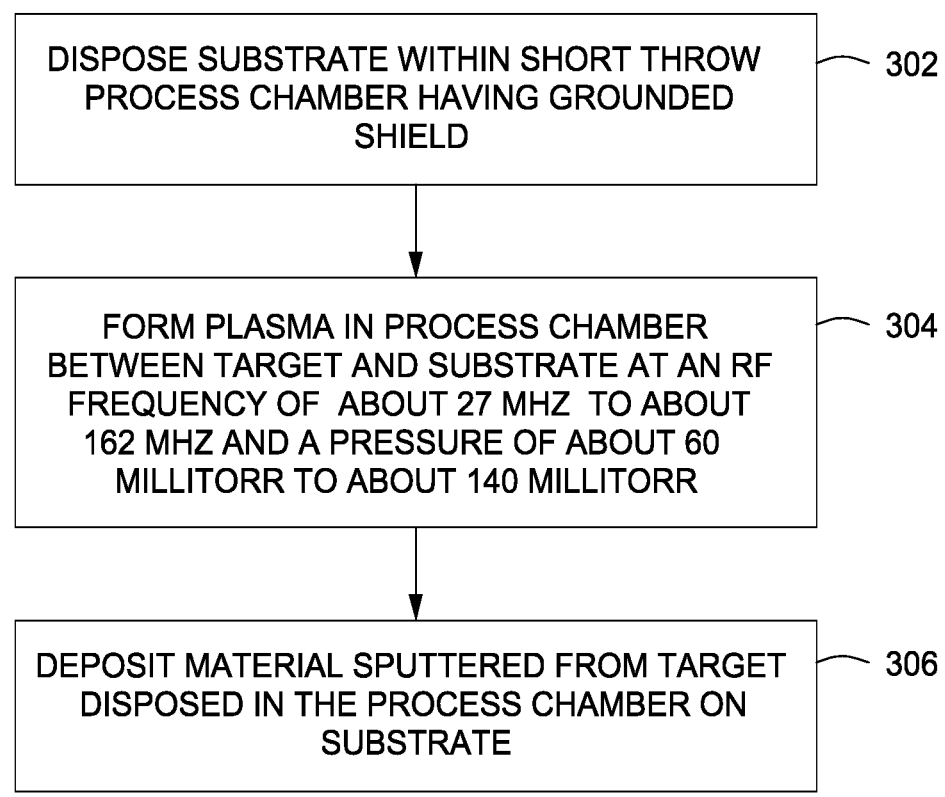
FIG. 3 depicts a flow chart for a method of processing a substrate in accordance with some embodiments of the present invention.

FIG. 3 depicts a flow chart for a method 300 of processing a substrate in accordance with some embodiments of the present invention. In some embodiments, at least some portions of the method 300 may be performed in a substrate processing apparatus, for example, such as the apparatus 100 described above with respect to FIGS. 1 and 2. In the method 300, at 302, a substrate 108 is disposed within a short throw process chamber having a grounded shield 138 as described above. At 304, a plasma is formed in the process chamber between the target 114 and the substrate 108 at an RF frequency of about 27 MHz to about 162 MHz and a pressure of about 60 millitorr to about 140 millitorr. Next, at 306, material sputtered from a target disposed in the short throw process chamber is deposited on the substrate 108. The plasma formed at the above frequency and pressure advantageously allows for a high deposition rate within the short throw process chamber while maintaining high ionization levels. In addition, the design of the grounded shield 138 advantageously provides reduced sputtering of the shield during processing under such conditions.

Thus, improved methods and apparatus for reducing the sputtering of a grounded shield in a process chamber have been disclosed herein. The inventive apparatus may advantageously allow for an increased deposition rate in a PVD chamber, without the contamination caused by the sputtering of the grounded shield.

While the foregoing is directed to embodiments of the present invention, other and further embodiments of the invention may be devised without departing from the basic scope thereof.

The invention claimed is:

1. A process kit shield for use in a physical vapor deposition chamber, comprising:
an electrically conductive body having an inner sidewall defining a central opening, wherein the body has a ratio of a surface area of inner facing surfaces of the inner sidewall to a height of the inner sidewall of about 2 to about 3, wherein the height is expressed in units of length, and the surface area is expressed in the units of length squared.

2. The process kit shield of claim 1, wherein the electrically conductive body is annular.

3. The process kit of claim 1, wherein the electrically conductive body is fabricated from one or more of an aluminum alloy or stainless steel.

4. The process kit of claim 1, wherein the inner sidewall of the electrically conductive body further comprises alternating concave portions and convex portions.

5. The process kit of claim 4, wherein a period of the concave portions is about 6 mm to about 20 mm.

6. The process kit of claim 4, wherein each of the concave portions is configured to allow a plasma sheath to form within each of the concave portions at an RF frequency of about 27 MHz to about 162 MHz and at chamber pressure of about 60 millitorr to about 140 millitorr.

7. The process kit of claim 1, wherein the inner sidewall of the electrically conductive body of the process kit shield includes a plurality of waves disposed between a target and a substrate support of a process chamber in which the process kit is inserted.

8. The process kit of claim 7, wherein the plurality of waves is arranged in a repeating pattern, and wherein each wave has a period of about 6 mm to about 20 mm.

9. A substrate processing apparatus, comprising:
a chamber body having a substrate support disposed therein;
a target coupled to the chamber body opposite the substrate support;
an RF power source to form a plasma within the chamber body; and
a process kit shield having an electrically conductive body, the electrically conductive body having an inner sidewall defining a central opening, wherein the electrically conductive body has a ratio of a surface area of inner facing surfaces of the inner sidewall to a height of the inner sidewall of about 2 to about 3, wherein the height is expressed in units of length, and the surface area is expressed in the units of length squared.

10. The substrate processing apparatus of claim 9, wherein a ratio of the diameter of the target to the diameter of a substrate disposed atop the substrate support is about 1.4.

11. The substrate processing apparatus of claim 9, wherein the inner sidewall includes a plurality of waves disposed between the target and the substrate support.

12. The substrate processing apparatus of claim 11, wherein the plurality of waves comprises alternating concave portions and convex portions.

13. The substrate processing apparatus of claim 12, wherein a period of the concave portions is about 6 mm to about 20 mm.

14. The substrate processing apparatus of claim 12, wherein each of the concave portions is configured to allow a plasma sheath to form within each of the concave portions at an RF frequency from the RF power source of about 27 MHz to about 162 MHz and at chamber pressure of about 60 millitorr to about 140 millitorr.

15. The substrate processing apparatus of claim 11, wherein the plurality of waves is arranged in a repeating pattern, and wherein each wave has a period of about 6 mm to about 20 mm.

16. The substrate processing apparatus of claim 9, wherein a ratio of a diameter of the target to a height of the process kit shield is about 4.1 to about 4.3, and wherein a ratio of a surface area of inner facing surfaces of the the inner sidewall to a surface area of a principal surface of the target is about 1 to about 1.5.

17. The substrate processing apparatus of claim 9, wherein the electrically conductive body of the process kit shield is annular.

18. The substrate processing apparatus of claim 9, wherein the electrically conductive body of the process kit shield is fabricated from one or more of an aluminum alloy or stainless steel.

19. The substrate processing apparatus of claim 9, wherein a distance between the target and a substrate having a diameter of 300 mm disposed atop the substrate support is about 50.8 mm to about 152.4 mm.

20. The substrate processing apparatus of claim 9, wherein a distance between the target and a substrate having a diameter of 450 mm disposed atop the substrate support is about 101.6 mm to about 203.2 mm.

* * * * *